United States Patent
Kim

(10) Patent No.: US 11,581,040 B2
(45) Date of Patent: *Feb. 14, 2023

(54) SEMICONDUCTOR MEMORY APPARATUS, OPERATION METHOD OF THE SEMICONDUCTOR MEMORY APPARATUS AND SYSTEM INCLUDING THE SEMICONDUCTOR MEMORY APPARATUS

(71) Applicant: SK hynix Inc., Icheon-si (KR)

(72) Inventor: Dong Keun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/344,674

(22) Filed: Jun. 10, 2021

(65) Prior Publication Data

US 2021/0304818 A1    Sep. 30, 2021

Related U.S. Application Data

(63) Continuation of application No. 16/444,446, filed on Jun. 18, 2019, now Pat. No. 11,062,768.

(30) Foreign Application Priority Data

Aug. 16, 2018 (KR) .......................... 10-2018-0095272

(51) Int. Cl.
*G11C 13/00* (2006.01)

(52) U.S. Cl.
CPC ........ *G11C 13/0004* (2013.01); *G11C 13/003* (2013.01); *G11C 13/004* (2013.01); *G11C 13/0069* (2013.01)

(58) Field of Classification Search
CPC . G11C 13/0004; G11C 13/003; G11C 13/004; G11C 13/0069; G11C 7/1051; G11C 16/08; G11C 16/10; G11C 16/26; G11C 7/1057; G11C 7/106; G11C 7/1078; G11C 7/1084; G11C 7/1087; G11C 8/12; G11C 7/1006

See application file for complete search history.

(56) References Cited

U.S. PATENT DOCUMENTS

| | | | |
|---|---|---|---|
| 7,471,556 B2 | 12/2008 | Chow et al. | |
| 11,062,768 B2 * | 7/2021 | Kim | G11C 16/08 |
| 2001/0007538 A1 | 7/2001 | Leung | |
| 2015/0161067 A1 | 6/2015 | Bowles et al. | |
| 2017/0069366 A1 | 3/2017 | Furuhashi et al. | |
| 2017/0270987 A1 | 9/2017 | Matsuoka | |

* cited by examiner

*Primary Examiner* — Jay W. Radke
(74) *Attorney, Agent, or Firm* — William Park & Associates Ltd.

(57) ABSTRACT

A semiconductor memory apparatus may include a memory bank, a global buffer array, and an input and output circuit. The memory bank includes a local data circuit, and the global buffer array includes a global data circuit. The local data circuit is operably coupled to the global data circuit. The global buffer array may be operably coupled to the input and output circuit. The memory bank is disposed in a core region, and the global buffer array and the input and output circuit may be disposed in a peripheral region separated from the core region.

20 Claims, 7 Drawing Sheets

SEMICONDUCTOR MEMORY APPARATUS, OPERATION METHOD OF THE SEMICONDUCTOR MEMORY APPARATUS AND SYSTEM INCLUDING THE SEMICONDUCTOR MEMORY APPARATUS

CROSS-REFERENCES TO RELATED APPLICATION

The present application is a continuation application of U.S. patent application Ser. No. 16/444,446, filed on Jun. 18, 2019, and claims priority under 35 U.S.C. § 119(a) to Korean application number 10-2018-0095272, filed on Aug. 16, 2018, in the Korean Intellectual Property Office, which is incorporated herein by reference in its entirety.

BACKGROUND

1. Technical Field

Various embodiments generally relate to an integrated circuit technology, and more particularly, to a semiconductor memory apparatus and a system including the same.

2. Related Art

An electronic device may include many electronic components. Among the electronic components, a computer system may include a large number of electronic components composed of semiconductor. The computer system may include a memory apparatus. A dynamic random access memory (DRAM) can store and output data at high and constant speed, and perform a random access. Thus, the DRAM is widely used as a general memory apparatus. However, since the DRAM includes memory cells each composed of a capacitor, the DRAM has a volatile characteristic of losing data stored therein when power supply is cut off. In order to remove such a disadvantage of the DRAM, a flash memory apparatus has been developed. Since the flash memory apparatus includes memory cells each composed of a floating gate, the flash memory apparatus may have a nonvolatile characteristic of retaining data stored therein, even though a power supply is cut off. However, the flash memory apparatus stores and outputs data at lower speed than the DRAM, and has difficulties in performing a random access.

Recently, next-generation memory apparatuses having a high operation speed and nonvolatile characteristics have been developed. Examples of the next-generation memory apparatuses may include a phase change RAM (PRAM), a magnetic RAM (MRAM), a resistive RAM (ReRAM) and a ferroelectric RAM (FRAM). The next-generation memory apparatuses can operate at high speeds while having nonvolatile characteristics. In particular, the PRAM including phase-change memory cells formed of chalcogenide may store data by changing the resistance values of the memory cells.

SUMMARY

In an embodiment, a semiconductor memory apparatus may include a local data circuit, a global data circuit, and an input and output circuit. The local data circuit may be disposed in a memory bank, coupled between a memory cell of the memory bank and a bank data line, and configured to perform an active write operation and an active read operation. The global data circuit may be disposed outside the memory bank, and configured to perform a buffer write operation and a buffer read operation between the bank data line and a global data line. The input and output circuit is coupled to the global data line, and configured to receive data from an external device or output data to the external device.

In an embodiment, a semiconductor memory apparatus may include a memory bank, global buffer array, and an input and output circuit. The memory bank may be disposed in a core region, and include a local data circuit. The global buffer array may be disposed in a peripheral region separated from the core region, and include a global data circuit operably coupled to the local data circuit. The input and output circuit may be disposed in the peripheral region, and operably coupled to the global buffer array. The local data circuit may perform an active write operation and an active read operation between the memory bank and the global buffer array. The global buffer array may perform a buffer write operation and a buffer read operation between the local data circuit and the input and output circuit.

DETAILED DESCRIPTION

Figure 1:
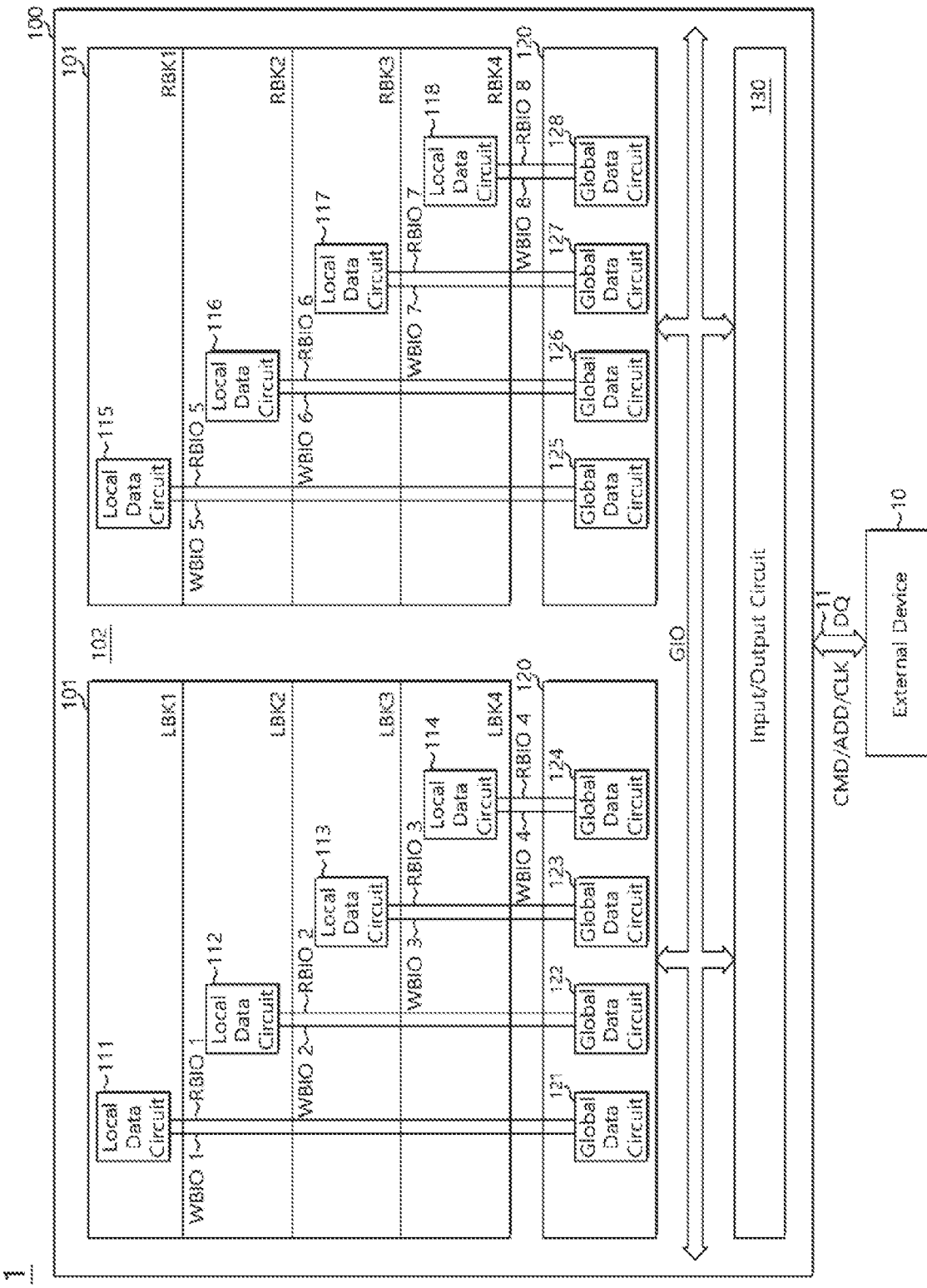
FIG. 1 illustrates configurations of a semiconductor system and a semiconductor memory apparatus in accordance with an embodiment.

Hereinafter, a semiconductor memory apparatus and a system including the same according to the present disclosure will be described below with reference to the accompanying drawings through examples of embodiments, FIG. 1 illustrates configurations of a semiconductor system 1 and a semiconductor memory apparatus 100 in accordance with an embodiment. The semiconductor system 1 may include an external device 10 and the semiconductor memory apparatus 100. The external device 10 and the semiconductor memory apparatus 100 may perform data communication with each other. The external device 10 may provide various control signals required for operations of the semiconductor memory apparatus 100.

The external device 10 may be a host device which controls the semiconductor memory apparatus 100 to perform various operations. For example, the external device 10 may include a central processing unit (CPU), graphic processing unit (GPU), multimedia processor (MMP), digital signal processor, application processor (AP) or memory controller, etc.

The semiconductor memory apparatus 100 may include a nonvolatile memory apparatus. For example, the semiconductor memory apparatus may include any nonvolatile memory apparatuses which have lower write/read speed than a dynamic RAM (DRAM). For example, the semiconductor memory apparatus 100 may include a flash memory, phase change RAM (PRAM), magnetic RAM (MRAM), resistive RAM (RRAM), ferroelectric RAM (FRAM) and the like. The semiconductor memory apparatus 100 may be a PRAM including memory cells formed of a phase change material.

The semiconductor memory apparatus 100 may be coupled to the external device 10 through a system bus 11. The system bus 11 may be a signal transfer path, link or channel for transferring a signal. The system bus 11 may include a command bus, address bus, dock bus, data bus and the like. The command bus, the address bus and the dock bus may be one-way buses, and the data bus may be a two-way bus. The external device 10 may provide a command signal CMD to the semiconductor memory apparatus 100 through the command bus, provide an address signal ADD to the semiconductor memory apparatus 100 through the address bus, and provide a clock signal CLK to the semiconductor memory apparatus 100 through the dock bus. The external device 10 may transfer data DQ to the semiconductor memory apparatus 100 through the data bus, and receive the data DQ transferred from the semiconductor memory apparatus 100 through the data bus.

Referring to FIG. 1, the semiconductor memory apparatus 100 may include a core region 101 and a peripheral region 102. The core region 101 may include a memory cell array for storing data. The core region 101 may include a data circuit for storing data in the memory cell array or outputting data stored in the memory cell array. Furthermore, the core region 101 may include a data line for transferring data between the core region 101 and the peripheral region 102. In FIG. 1, a plurality of memory banks may be arranged in the core region 101. For example, the semiconductor memory apparatus 100 may include eight memory banks arranged in the core region 101. However, the number of memory banks included in the semiconductor memory apparatus 100 may not be limited thereto, That is, the number of memory banks may be equal to or less than 8 or more than 8.

The semiconductor memory apparatus 100 may include a first left memory bank LBK1, a first right memory bank RBK1, a second left memory bank LBK2, a second right memory bank RBK2, a third left memory bank LBK3, a third right memory bank RBK3, a fourth left memory bank LBK4 and a fourth right memory bank RBK4, The memory banks may be operated as one bank, and separated into different banks which are individually operated. For example, the memory banks may operate as eight independent memory banks. Furthermore, left and right memory banks may operate as one memory bank. The first to fourth left memory banks LBK1 to LBK4 and the first to fourth right memory banks RBK1 to RBK4 may include local data circuits 111, 112, 113, 114, 115, 116, 117, and 118, respectively. The local data circuits 111 to 118 may be coupled to the peripheral region 102 through bank data lines, respectively. In an embodiment, the local data circuits 111 to 118 are coupled to the peripheral region 102 through bank data lines in a one-to-one manner whereby a single local data circuit is coupled to the peripheral region 102 through a single bank data line. The bank data lines may include bank write lines and bank read lines.

The peripheral region 102 may be separated from the core region 101, and positioned outside the core region 101. The peripheral region 102 may include a global buffer array 120 and an input and output circuit 130. Although not illustrated, the peripheral region 102 may include various internal circuits capable of controlling the semiconductor memory apparatus 100 to perform various operations, in addition to the global buffer array 120 and the input and output circuit 130. The global buffer array 120 may be disposed adjacent to the core region 101, for example. The global buffer array 120 may be disposed more adjacent to the core region 101 than the input and output circuit 130. In an embodiment, the global buffer array 120 may be disposed between the core region 101 and the input and output circuit 130. The global buffer array 120 may include a plurality of global data circuits 121, 122, 123, 124, 125, 126, 127, and 128. The global data circuits 121 to 128 may be assigned to the respective memory banks, and correspond to the number of the memory banks. In an embodiment, the global data circuits 121 to 128 may be assigned to the memory banks in a one-to-one manner whereby a single global data circuit is assigned to a single memory bank. The plurality of global data circuits 121 to 128 may be operably coupled to the local data circuits 111 to 118 included in the plurality of memory banks through the bank data lines, respectively. In an embodiment, the plurality of global data circuits 121 to 128 are operably coupled to the local data circuits 111 to 118 included in the plurality of memory banks through the bank data lines in a one-to-one manner whereby a single global data circuit is operably coupled to a single local data circuit included in the plurality of memory banks through a single bank data line. The peripheral region 102 may further include a global data line OHIO) for transferring data between the global buffer array 120 and the input and output circuit 130.

The coupling relationships among the components of the semiconductor memory apparatus will be described as follows. The local data circuit 111 of the first left memory bank LBK1 may be coupled to the global data circuit 121. The local data circuit 111 may be coupled to the global data circuit 121 through a bank write line WBIO1 and a bank read line RBIO1. The local data circuit 111 may receive data outputted from the global data circuit 121 through the bank write line WBIO1, and output data to the global data circuit 121 through the bank read line RBIO1. The global data circuit 121 may output data to the local data circuit 111 through the bank write line WBIO1, and receive data outputted from the local data circuit 111 through the bank read line RBIO1.

The local data circuit 112 of the second left memory bank LBK2 may be coupled to the global data circuit 122. The local data circuit 112 may be coupled to the global data circuit 122 through a bank write line WBIO2 and a bank read line RBIO2. The local data circuit 112 may receive data outputted from the global data circuit 122 through the bank write line WBIO2, and output data to the global data circuit 122 through the bank read line RBIO2. The global data circuit 122 may output data to the local data circuit 112 through the bank write line WBIO2, and receive data outputted from the local data circuit 112 through the bank read line RBIO2.

The local data circuit 113 of the third left memory bank LBK3 may be coupled to the global data circuit 123. The local data circuit 113 may be coupled to the global data circuit 123 through a bank write line WBIO3 and a bank read line RBIO3. The local data circuit 113 may receive data outputted from the global data circuit 123 through the bank write line WBIO3, and output data to the global data circuit 123 through the bank read line RBIO3. The global data circuit 123 may output data to the local data circuit 113 through the bank write line WBIO3, and receive data outputted from the local data circuit 113 through the bank read line RBIO3.

The local data circuit 114 of the fourth left memory bank LBK4 may be coupled to the global data circuit 124. The local data circuit 114 may be coupled to the global data circuit 124 through a bank write line WBIO4 and a bank read line RBIO4. The local data circuit 114 may receive data outputted from the global data circuit 124 through the bank write line WBIO4, and output data to the global data circuit 124 through the bank read line RBIO4. The global data circuit 124 may output data to the local data circuit 114 through the bank write line WBIO4, and receive data outputted from the local data circuit 114 through the bank read line RBIO4.

The local data circuit 115 of the first right memory bank RBK1 may be coupled to the global data circuit 125, The local data circuit 115 may be coupled to the global data circuit 125 through a bank write line WBIO5 and a bank read line RBIO5. The local data circuit 115 may receive data outputted from the global data circuit 125 through the bank write line WBIO5, and output data to the global data circuit 125 through the bank read line RBIO5. The global data circuit 125 may output data to the local data circuit 115 through the bank write line WBIO5, and receive data outputted from the local data circuit 115 through the bank read line RBIO5.

The local data circuit 116 of the second right memory bank RBK2 may be coupled to the global data circuit 126. The local data circuit 116 may be coupled to the global data circuit 126 through a bank write line WBIO6 and a bank read line RBIO6. The local data circuit 116 may receive data outputted from the global data circuit 126 through the bank write line WBIO6, and output data to the global data circuit 126 through the bank read line RBIO6, The global data circuit 126 may output data to the local data circuit 116 through the bank write line WBIO6, and receive data outputted from the local data circuit 116 through the bank read line RBIO6.

The local data circuit 117 of the third right memory bank RBK3 may be coupled to the global data circuit 127. The local data circuit 117 may be coupled to the global data circuit 127 through a bank write line WBIO7 and a bank read line RBIO7. The local data circuit 117 may receive data outputted from the global data circuit 127 through the bank write line WBIO7, and output data to the global data circuit 127 through the bank read line RBIO7. The global data circuit 127 may output data to the local data circuit 117 through the bank write line WBIO7, and receive data outputted from the local data circuit 117 through the bank read line RBIO7.

The local data circuit 118 of the fourth right memory bank RBK4 may be coupled to the global data circuit 128, The local data circuit 118 may be coupled to the global data circuit 128 through a bank write line WBIO8 and a bank read line RBIO8. The local data circuit 118 may receive data outputted from the global data circuit 128 through the bank write line WBIO8, and output data to the global data circuit 128 through the bank read line RBIO8. The global data circuit 128 may output data to the local data circuit 118 through the bank write line WBIO8, and receive data outputted from the local data circuit 118 through the bank read line RBIO8.

The input and output circuit 130 may communicate with the external device 10 through the system bus 11, and function as an interface circuit of the semiconductor memory apparatus 100. The input and output circuit 130 may be operably coupled to the global buffer array 120. The input and output circuit 130 may output data transferred through the system bus 11 from the external device 10 to the global data line GIO, and output data transferred through the global data line GIO to the external device 10 through the system bus 11. The data transferred through the system bus 11 may be serial data, and the data transferred through the global data line GIO may be parallel data. The input and output circuit 130 may include a deserializer for converting the serial data into the parallel data and a serializer for converting the parallel data into the serial data. The input and output circuit 130 may transfer data to the global buffer array 120 or receive data outputted from the global buffer array 120, through the global data line GIO.

The semiconductor memory apparatus 100 may perform an active write operation, active read operation, buffer write operation and buffer read operation. The active write operation, the active read operation, the buffer write operation and the buffer read operation may be performed based on the command signal CMD provided from the external device 10. The active write operation and the active read operation may correspond to data communication performed between the core region 101 and the peripheral region 102. The buffer write operation and the buffer read operation may correspond to data communication performed between the peripheral region 102 and the external device 10.

The active write operation may indicate a write operation performed between the memory banks LBK1 to LBK4 and RBK1 to RBK4 and the global buffer array 120. The local data circuits 111 to 118 may perform the active write operation between the memory cells of the memory banks LBK1 to LBK4 and RBK1 to RBK4 and the bank data lines, respectively. In an embodiment, the local data circuits 111 to 118 may perform the active write operation between the memory cells of the memory banks LBK1 to LBK4 and RBK1 to RBK4 and the bank data lines in a one-to-one manner whereby a single local data circuit performs the active write operation between the memory cells of a single memory bank and a single bank data line. The semiconductor memory apparatus 100 may receive an address signal ADD for selecting a memory bank and a memory cell in which the active write operation is to be performed, with a command signal CMD for performing the active write operation, Based on the address signal ADD, a specific memory cell of a specific memory bank, in which the active write operation is to be performed, may be selected. For example, the active write operation for the first left memory bank may indicate an operation in which the local data circuit 111 writes data transferred to the bank write line WBIO1 from the global data circuit 121 to a selected memory cell of the first left memory bank LBK1.

The active read operation may indicate a read operation performed between the memory banks LBK1 to LBK4 and RBK1 to RBK4 and the global buffer array 120. The local data circuits 111 to 118 may perform the active read operation between the memory cells of the memory banks LBK1 to LBK4 and RBK1 to RBK4 and the bank data lines, respectively. In an embodiment, the local data circuits 111 to 118 may perform the active read operation between the memory cells of the memory banks LBK1 to LBK4 and RBK1 to RBK4 and the bank data lines in a one-to-one manner whereby a single local data circuit performs the active read operation between the memory cells of a single memory bank and a single bank data line. The semiconductor memory apparatus 100 may receive an address signal ADD for selecting a memory bank and a memory cell in which the active read operation is to be performed, with a command signal CMD for performing the active read operation. Based on the address signal ADD, a specific memory cell of a specific memory bank, in which the active read operation is to be performed, may be selected. For example, the active read operation for the first left memory bank LBK1 may indicate an operation in which the local data circuit 111 reads data stored in a selected memory cell of the first left memory bank LBK1 and transfers the read data to the global data circuit 122 through the bank read line RBIO1.

The buffer write operation may be a write operation performed between the global buffer array 120 and the input and output circuit 130. The global data circuits 121 to 128 of the global buffer array 120 may perform the buffer write operation between the respective bank data lines and the global data line GIO. The semiconductor memory apparatus 100 may receive an address signal ADD for selecting a memory bank in which the buffer write operation is to be performed, with a command signal CMD for performing the buffer write operation. Among the plurality of global data circuits 121 to 128 of the global buffer array 120, a specific global data circuit coupled to the memory bank which is selected based on the address signal ADD may perform the buffer write operation. For example, the buffer write operation for the first left memory bank LBK1 may indicate an operation in which the global data circuit 121 transfers data transferred through the global data line GIO from the input and output circuit 130 to the bank write line WBIO1. The global data circuit 121 may latch and store the data transferred through the global data line GIO.

The buffer read operation may be a read operation performed between the global buffer array 120 and the input and output circuit 130. The global data circuits 121 to 128 of the global buffer array 120 may perform the buffer read operation between the respective bank data lines and the global data line GIO. The semiconductor memory apparatus 100 may receive an address signal ADD for selecting a memory bank in which the buffer read operation is to be performed, with a command signal CMD for performing the buffer read operation, Among the plurality of global data circuits 121 to 128 of the global buffer array 120, a specific global data circuit coupled to the memory bank which is selected based on the address signal ADD may perform the buffer read operation. For example, the buffer read operation for the first left memory bank LBK1 may indicate an operation in which the global data circuit 121 transfers data transferred through the bank read line RBIO1 from the local data circuit 111 to the input and output circuit 130 through the global data line GIO. The global data circuit 121 may latch and store the data transferred through the bank read line RBIO1.

The semiconductor memory apparatus 100 may separately perform the active write operation, the active read operation, the buffer write operation and the buffer read operation. When the active write operation and the active read operation are performed separately from the buffer write operation and the buffer read operation, the operation speed and efficiency of the semiconductor memory apparatus may be increased. When a nonvolatile memory apparatus including a PRAM writes data to a memory cell or reads data stored in a memory cell, the nonvolatile memory apparatus may require a longer time than a volatile memory apparatus including a DRAM. Therefore, the semiconductor memory apparatus 100 may perform the buffer write operation and the buffer read operation such that the semiconductor memory apparatus 100 and the external device 10 can perform data communication at high speed. Furthermore, the semiconductor memory apparatus 100 may perform interleaved write and read operations with a plurality of memory banks by performing the active write operation and the active read operation separately from the buffer write operation and the buffer read operation. Furthermore, by performing the active write operation and the active read operation in parallel with the buffer write operation and the buffer read operation, the semiconductor memory apparatus 100 can reduce the time required for writing data to a memory cell or reading data stored in a memory cell, and increase the efficiency of the write and read operations.

The local data circuits 111 to 118 may write data to memory cells of the plurality of memory banks LBK1 to LBK4 and RBK1 to RBK4 based on the data on the bank write lines WBIO1 to WBIO8 and the bank read lines RBIO1 to RBIO8 during the respective active write operations for the memory banks LBK1 to LBK4 and RBK1 to RBK4. The local data circuits 111 to 118 may read data stored in memory cells of the memory banks LBK1 to LBK4 and RBK1 to RBK4 and output the read data to the bank read lines RBIO1 to RBIO8, during the respective active read operations for the memory banks LBK1 to LBK4 and RBK1 to RBK4.

The global data circuits 121 to 128 may output data transferred through the global data line GIO to the local data circuits 111 to 118 through the bank write lines WBIO1 to WBIO8 during the respective buffer write operations for the memory banks LBK1 to LBK4 and RBK1 to RBK4, The global data circuits 121 to 128 may output data to the global data line GIO based on the data on the bank write lines WBIO1 to WBIO8 and the bank read lines RBIO1 to RBIO8 during the respective buffer read operations for the memory banks LBK1 to LBK4 and RBK1 to RBK4.

In order to describe the operation of the semiconductor memory apparatus 100, the operations of the local data circuit 111 of the first left memory bank LBK1 and the global data circuit 121 coupled to the local data circuit 111 will be representatively described. The semiconductor memory apparatus 100 may perform the active write operation, the active read operation, the buffer write operation and the buffer read operation for the first left memory bank LBK1 in various orders. When the semiconductor memory apparatus 100 performs the active write operation after performing the buffer write operation on the first left memory bank LBK1, a write operation of the local data circuit 111 may be performed after a write operation of the global data circuit 121 is performed. During the buffer write operation, the global data circuit 121 may receive data transferred through the input and output circuit 130 from the external device 10 through the global data line GIO, and output the data received through the global data line GIO to the bank write line WBIO1. During the active write operation, the local data circuit 111 may write data to a memory cell of the first left memory bank LBK1 based on the data transferred through the bank write line WBIO1 from the global data circuit 121. When the buffer write operation is performed before the active write operation, the local data circuit 111 may write data to the memory cell based on the data on the bank write line WBIO1.

When the semiconductor memory apparatus 100 performs the active write operation after performing the active read operation on the first left memory bank LBK1, the local data circuit 111 may read data stored in a selected memory cell of the first left memory bank LBK1 and output the read data to the bank read line RBIO1, during the active read operation. During the active write operation, the local data circuit 111 may write the data on the bank read line RBIO1 to the memory cell selected during the active read operation or another memory cell, instead of the data on the bank write line WBIO1. In order to perform the active write operation, the memory cell selected during the active read operation based on the address signal ADD received from the external device 10 may be reselected, or another memory cell may be selected. When the active read operation is performed before the active write operation, the local data circuit 111 may write data to the memory cell based on the data on the bank read line RBIO1.

When the semiconductor memory apparatus 100 performs the buffer read operation after performing the active read operation on the first left memory bank LBK1, a read operation of the global data circuit 121 may be performed after a read operation of the local data circuit 111 is performed. During the active read operation, the local data circuit 111 may read data stored in a memory cell of the first left memory bank LBK1, and output the read data to the bank read line RBIO1. During the buffer read operation, the global data circuit 121 may output the data to the global data line GIO based on the data received through the bank read line RBIO1, The input and output circuit 130 may output the data transferred through the global data line GIO to the external device 10 through the system bus 11, When the active read operation is performed before the buffer read operation, the global data circuit 121 may output data to the global data line GIO based on the data on the bank read line RBIO1.

When the semiconductor memory apparatus 100 performs the buffer read operation after performing the buffer write operation on the first left memory bank LBK1, a read operation of the global data circuit 121 may be performed after a write operation of the global data circuit 121 is performed. During the buffer write operation, the global data circuit 121 may output data transferred through the global data line GIO from the input and output circuit 130 to the bank write line WBIO1. During the buffer read operation, the global data circuit 121 may output the data on the bank write line WBIO1 to the input and output circuit 130 through the global data line GIO instead of the data on the bank read line RBIO1, and the input and output circuit 130 may output the data transferred through the global data line GIO to the external device 10 through the system bus 11. When the buffer write operation is performed before the buffer read operation, the global data circuit 121 may output data to the global data line GIO based on the data on the bank write line WBIO1.

When the semiconductor memory apparatus 100 performs the active read operation on a selected memory cell of the first left memory bank LBK1, the local data circuit 111 may output data stored in the selected memory cell to the bank read line RBIO1. Then, when the active write operation is performed on the selected memory cell of the first left memory bank LBK1, the local data circuit 111 may compare the data located on the bank read line RBIO1 to data located on the bank write line WBIO1. The data on the bank write line WBIO1 may indicate data outputted from the global data circuit 121 by the previously performed buffer write operation. When the data on the bank read line RBIO1 and the data on the bank write line WBIO1 are different from each other, the local data circuit 111 may write the data on the bank write line WBIO1 to the selected memory cell. When the data on the bank read line RBIO1 and the data on the bank write line WBIO1 are equal to each other, the local data circuit 111 may not perform a write operation on the selected memory cell.

Figure 2:
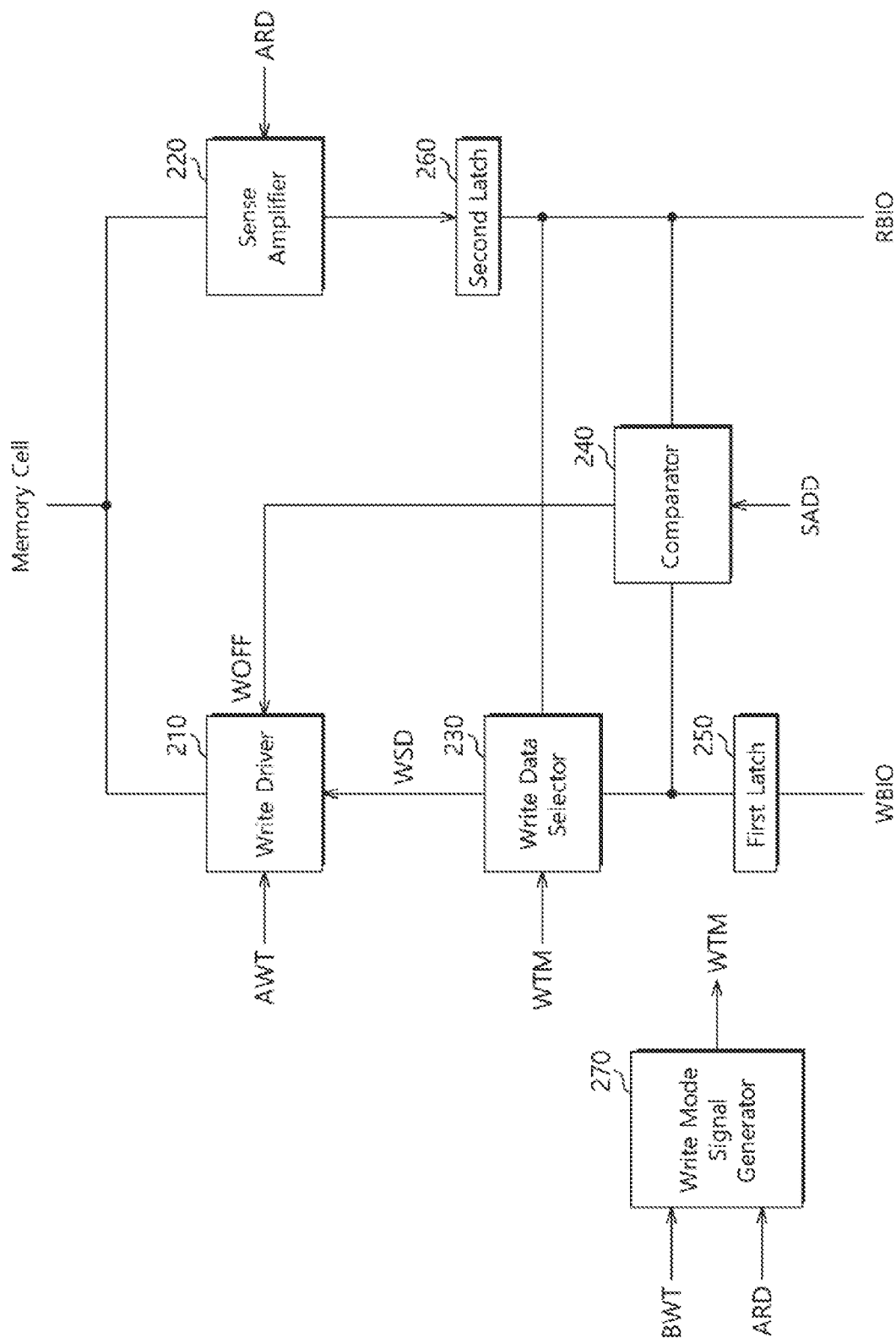
FIG. 2 illustrates a configuration of a local data circuit in accordance with an embodiment.

FIG. 2 illustrates a configuration of a local data circuit 200 in accordance with an embodiment. The local data circuit 200 may be applied as each of the local data circuits 111 to 118 installed in the plurality of memory banks LBK1 to LBK4 and RBK1 to RBK4 illustrated in FIG. 1. Referring to FIG. 2, the local data circuit 111 may include a write driver 210, a sense amplifier 220 and a write data selector 230. The write driver 210 may perform a write operation on a memory cell coupled to the write driver 210 during an active write operation. The memory cell may be coupled to the write driver 210 through an access line such as a bit line, global bit line, word line or global word line. The write driver 210 may perform a write operation based on an active write signal AWT and write select data WSD. The active write signal AWT may be generated based on a command signal CMD for performing the active write operation. The write driver 210 may write the write select data WSD to the memory cell when the active write signal AWT is enabled.

The sense amplifier 220 may perform a read operation on a memory cell coupled to the sense amplifier 220 during an active read operation. The memory cell may be coupled to the sense amplifier 220 through an access line such as a bit line, global bit line, word line or global word line. The sense amplifier 220 may perform a read operation based on an active read signal ARD. The active read signal ARD may be generated based on a command signal CMD for performing the active read operation. The sense amplifier 220 may be coupled to the bank read line RBIO. When the active read signal ARD is enabled, the sense amplifier 220 may read data stored in the memory cell, and output the read data to the bank read line RBIO.

The write data selector 230 may be coupled to the bank write line WBIO and the bank read line RBIO. The write data selector 230 may receive a write mode signal WTM, and output one of the data of the bank write line WBIO and the data of the bank read line RBIO as the write select data WSD based on the write mode signal WTM. The write mode signal WTM may include a flag signal which is generated based on an operation performed by the semiconductor memory apparatus 100, For example, when a buffer write operation is performed before the active write operation, the write mode signal WTM may have a first level. When an active read operation is performed before the active write operation, the write mode signal WTM may have a second level. When the write mode signal WTM has the first level, the write data selector 230 may output the data on the bank write line WBIO as the write select data WSD. When the write mode signal WTM has the second level, the write data selector 230 may output the data on the bank read line RBIO as the write select data WSD.

Referring to FIG. 2, the local data circuit 200 may further include a comparator 240. The comparator 240 may be coupled to the bank write line WBIO and the bank read line RBIO, The comparator 240 may receive an address flag SADD, and generate a write driver off signal WOFF. The address flag SADD may have the first level when an active read operation is performed on a specific memory cell before an active write operation is performed on the specific memory cell. That is, when the same memory cell as the memory cell on which the active read operation was performed before the active write operation is reselected, the address flag SADD may have the first level. The address flag SADD may have the second level when an active read operation is performed on another memory cell before the active write operation is performed on the specific memory cell.

The comparator 240 may be disabled when the address flag SADD has the second level. When the address flag SADD has the first level, the comparator 240 may compare the data on the bank write line WBIO to the data on the bank read line RBIO. When the data on the bank write line WBIO and the data on the bank read line RBIO are different from each other, the comparator 240 may disable the write driver off signal WOFF. The write driver 210 may write the write select data WSD, outputted based on the data on the bank write line WBIO, to a memory cell. When the data on the bank write line WBIO and the data on the bank read line RBIO are equal to each other, the comparator 240 may enable the write driver off signal WOFF. When the write driver off signal WOFF is enabled, the write driver 210 may be disabled so as not to perform a write operation.

The local data circuit 200 may further include a first latch 250 and a second latch 260, The first latch 250 may be coupled to the bank write line WBIO, The first latch 250 may latch and store the data transferred through the bank write line WBIO. In an embodiment, data located on the bank write line WBIO refers to data stored in the first latch 250 of the bank write line WBIO. The first latch 250 then provides the data to the bank write line WBIO which is received by the write data selector 230, the comparator 240, the write latch 510, and the read data selector 530. The second latch 260 may be coupled to the bank read line RBIO, The second latch 260 may latch and store the data transferred through the bank read line RBIO. In an embodiment, data located on the bank read line RBIO refers to data stored in the second latch 260 of the bank read line RBIO, The second latch 260 then provides the data to the bank read line RBIO which is received by the write data selector 230, comparator 240, and read data selector 530.

The local data circuit 200 may further include a write mode signal generator 270. The write mode signal generator 270 may receive a buffer write signal BWT and the active read signal ARD, and generate the write mode signal WTM. The buffer write signal BWT may be generated based on the command signal CMD for performing the buffer write operation. When the buffer write signal BWT is enabled, the write mode signal generator 270 may change the write mode signal WTM to the first level, and retain the voltage level of the write mode signal WTM. When the active read signal ARD is enabled, the write mode signal generator 270 may change the write mode signal WTM to the second level, and retain the voltage level of the write mode signal WTM.

Figure 3:
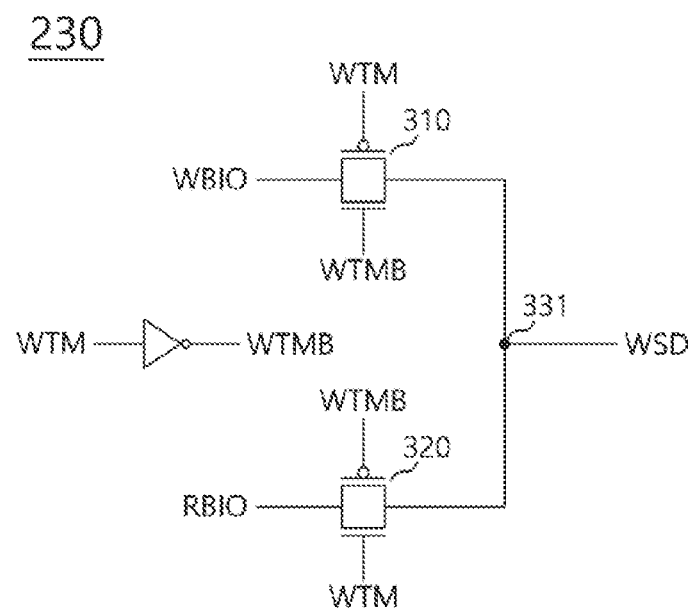
FIG. 3 illustrates a configuration of a write data selector illustrated in FIG. 2.

FIG. 3 illustrates a configuration of the write data selector 230 illustrated in FIG. 2. Referring to FIG. 3, the write data selector 230 may include a first pass gate 310 and a second pass gate 320. The first pass gate 310 may receive the write mode signal WTM, and couple the bank write line WBIO to an output node 331 based on the write mode signal WTM. When the write mode signal WTM has the first level and a complementary signal WTMB of the write mode signal WTM has the second level, the first pass gate 310 may be turned on to couple the bank write line WBIO to the output node 331, and output the data of the bank write line WBIO as the write select data WSD. The first level may be set to a low level, and the second level may be set to a high level.

The second pass gate 320 may receive the write mode signal WTM, and couple the bank read line RBIO to the output node 331 based on the write mode signal WTM. When the write mode signal WTM has the second level and the complementary signal WTMB of the write mode signal WTM has the first level, the second pass gate 320 may be turned on to couple the bank read line RBIO to the output node 331, and output the data of the bank read line RBIO as the write select data WSD.

Figure 4:
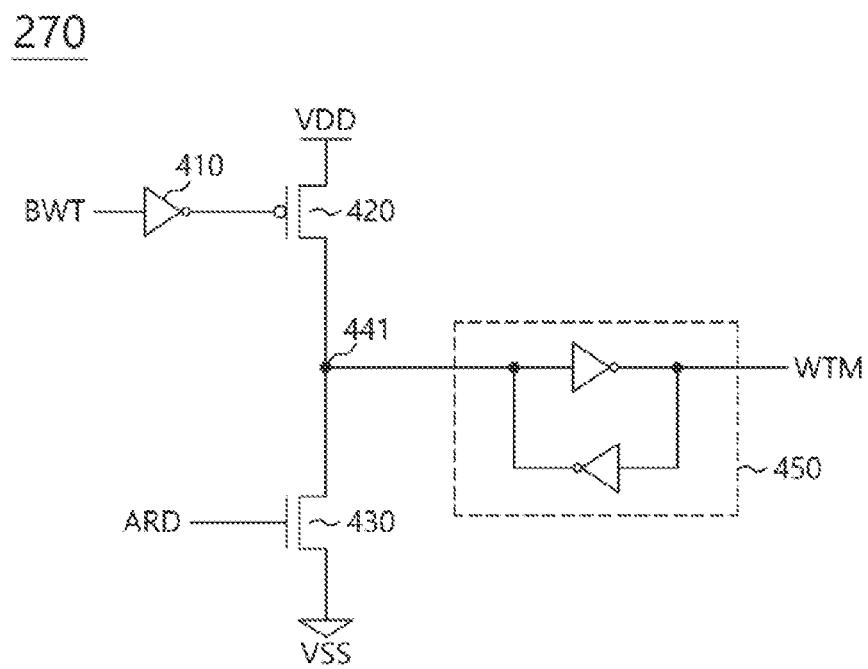
FIG. 4 illustrates a configuration of a write mode signal generator illustrated in FIG. 2.

FIG. 4 illustrates a configuration of the write mode signal generator 270 illustrated in FIG. 2, Referring to FIG. 4, the write mode signal generator 270 may include an inverter 410, a first transistor 420, a second transistor 430 and a latch 450. The inverter 410 may invert and output the buffer write signal BWT. The first transistor 420 may be a P-channel MOS transistor, for example. The first transistor 420 may have a gate configured to receive the output of the inverter 410, a source coupled to a supply voltage terminal VDD, and a drain coupled to a node 441. When the buffer write signal BWT is enabled at a high level, the first transistor 420 may drive the node 441 to the supply voltage VDD. The second transistor 430 may be an N-channel MOS transistor, for example. The second transistor 430 may have a gate configured to receive the active read signal ARD, a drain coupled to the node 441, and a source coupled to a ground voltage terminal VSS. When the active read signal ARD is enabled at a high level, the second transistor 430 may drive the node 441 to the ground voltage VSS. The latch 450 may generate the write mode signal WTM by inverting the voltage level of the node 441, and retain the level of the write mode signal WTM.

Figure 5:
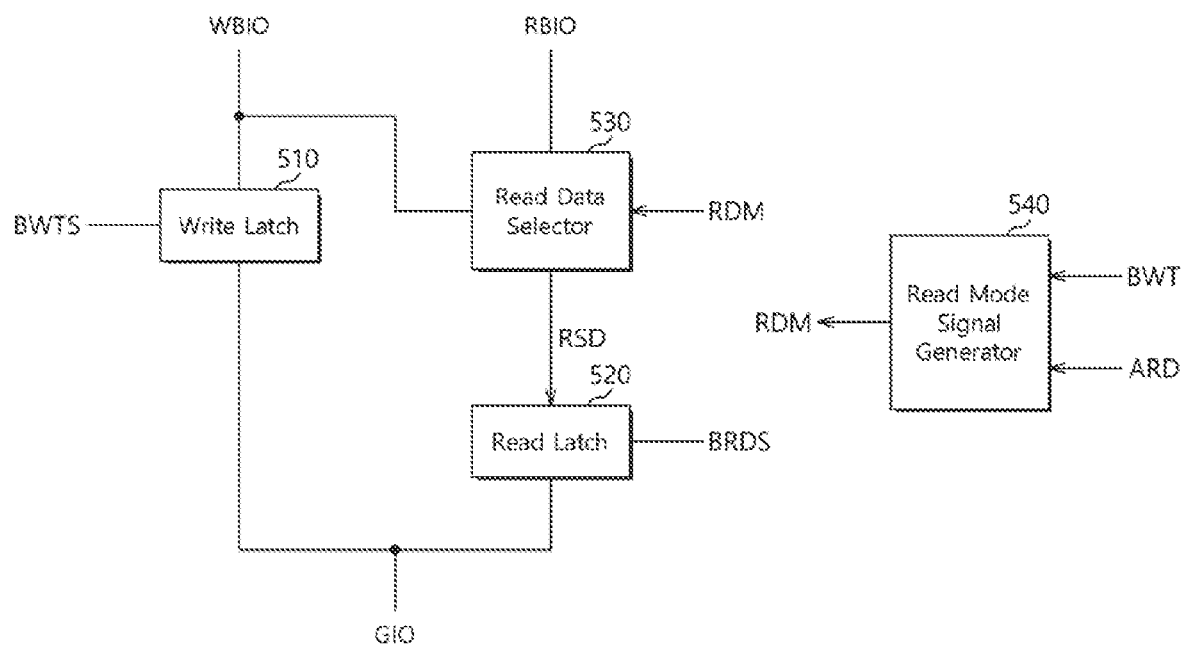
FIG. 5 illustrates a configuration of a global data circuit in accordance with an embodiment.

FIG. 5 illustrates a configuration of a global data circuit 500 in accordance with an embodiment. The global data circuit 500 may be applied as each of the global data circuits 121 to 128 illustrated in FIG. 1, Referring to FIG. 5, the global data circuit 500 may include a write latch 510, a read latch 520 and a read data selector 530. The write latch 510 may latch data transferred through the global data line GIO and output the latched data to the bank write line WBIO, based on the buffer write signal BWT. The write latch 510 may receive a buffer write strobe signal BWTS. The write latch 510 may strobe the data transferred through the global data line GIO and latch the strobed data, based on the buffer write strobe signal BWTS, The buffer write strobe signal BWTS may be a pulse signal which is generated based on the buffer write signal BWT.

The read latch 520 may latch the read select data RSD and output the latched data to the global data line GIO, based on a buffer read signal BRD. The buffer read signal BRD may be generated based on the command signal CMD for performing the buffer read operation. The read latch 520 may receive a buffer read strobe signal BRDS. The read latch 520 may strobe the read select data RSD and latch the strobed data, based on the buffer read strobe signal BRDS. The buffer read strobe signal BRDS may be a pulse signal which is generated based on the buffer read signal BRD.

The read data selector 530 may be coupled to the bank write line WBIO and the bank read line RBIO. The read data selector 530 may receive a read mode signal RDM, and output one of the data located on the bank write line WBIO and the data located on the bank read line RBIO as the read select data RSD based on the read mode signal RDM. The read mode signal RDM may be generated based on an operation performed by the semiconductor memory apparatus 100. For example, when a buffer write operation is performed before the buffer read operation, the read mode signal RDM may have the first level. When an active read operation is performed before the buffer read operation, the read mode signal RDM may have the second level. When the read mode signal RDM has the first level, the read data selector 530 may output the data located on the bank write line WBIO as the read select data RSD, When the read mode signal RDM has the second level, the read data selector 530 may output the data located on the bank read line RBIO as the read select data RSD.

The global data circuit 500 may further include a read mode signal generator 540. The read mode signal generator 540 may receive the buffer write signal BWT and the active read signal ARD, and generate the read mode signal RDM. When the buffer write signal BWT is enabled, the read mode signal generator 540 may change the read mode signal RDM to the first level, and retain the voltage level of the read mode signal RDM. When the active read signal ARD is enabled, the read mode signal generator 540 may change the read mode signal RDM to the second level, and retain the voltage level of the read mode signal RDM.

Figure 6:
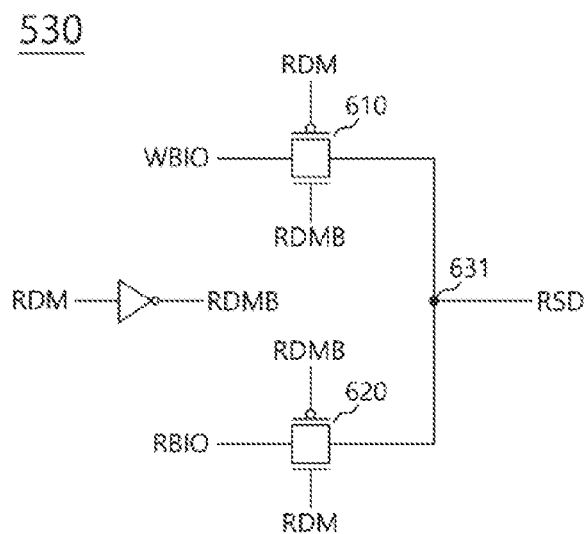
FIG. 6 illustrates a configuration of a read data selector illustrated in FIG. 5.
Figure 7:
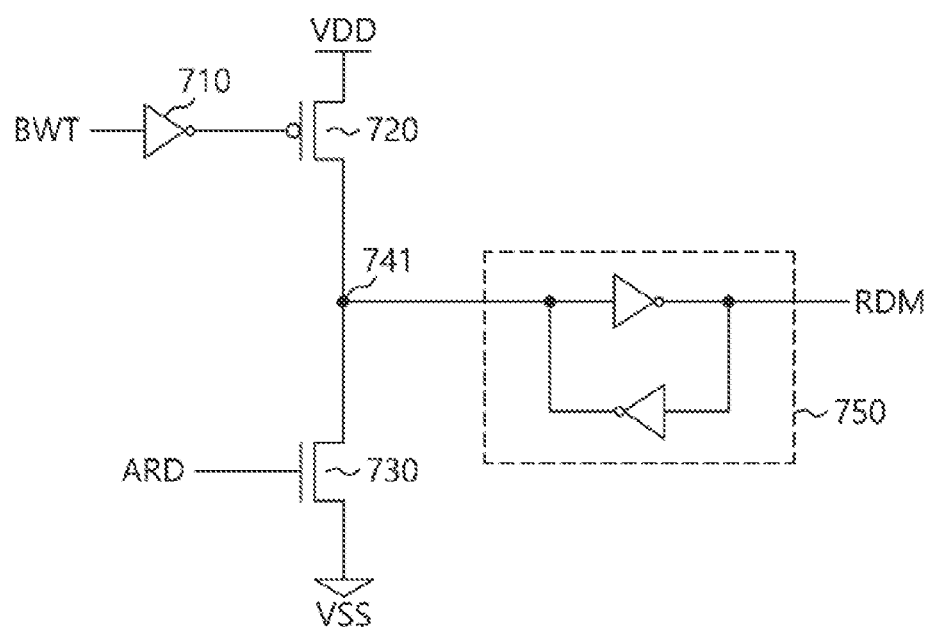
FIG. 7 illustrates a configuration of a read mode selector illustrated in FIG. 5.

FIG. 6 illustrates a configuration of the read data selector 530 illustrated in FIG. 5. Referring to FIG. 6, the read data selector 530 may include a first pass gate 610 and a second pass gate 620. The first pass gate 610 may receive the read mode signal RDM, and couple the bank write line WBIO to an output node 631 based on the read mode signal RDM. When the read mode signal RDM has the first level and the complementary signal RDMB of the read mode signal RDM has the second level, the first pass gate 610 may be turned on to couple the bank write line WBIO to the output node 631, and output the data on the bank write line WBIO as the read select data RSD. The second pass gate 620 may receive the read mode signal RDM, and couple the bank read line RBIO to the output node 631 based on the read mode signal RDM. When the read mode signal RDM has the second level and the complementary signal RDMB of the read mode signal RDM has the first level, the second pass gate 620 may be turned on to couple the bank read line RBIO to the output node 631, and output the data on the bank read line RBIO as the read select data RSD, FIG. 7 illustrates a configuration of the read mode signal generator 540 illustrated in FIG. 5. Referring to FIG. 7, the read mode signal generator 540 may include an inverter 710, a first transistor 720, a second transistor 730 and a latch 750. The inverter 710 may invert and output the buffer write signal BWT. The first transistor 720 may be a P-channel MOS transistor, for example. The first transistor 720 may have a gate configured to receive the output of the inverter 710, a source coupled to a supply voltage terminal VDD, and a drain coupled to a node 741. When the buffer write signal BWT is enabled at a high level, the first transistor 720 may drive the node 741 to the supply voltage VDD. The second transistor 730 may be an N-channel MOS transistor, for example. The second transistor 730 may have a gate configured to receive the active read signal ARD, a drain coupled to the node 741, and a source coupled to a ground voltage terminal VSS. When the active read signal ARD is enabled at a high level, the second transistor 730 may drive the node 741 to the ground voltage VSS. The latch 750 may generate the read mode signal RDM by inverting the voltage level of the node 741, and retain the level of the read mode signal RDM.

Figure 8:
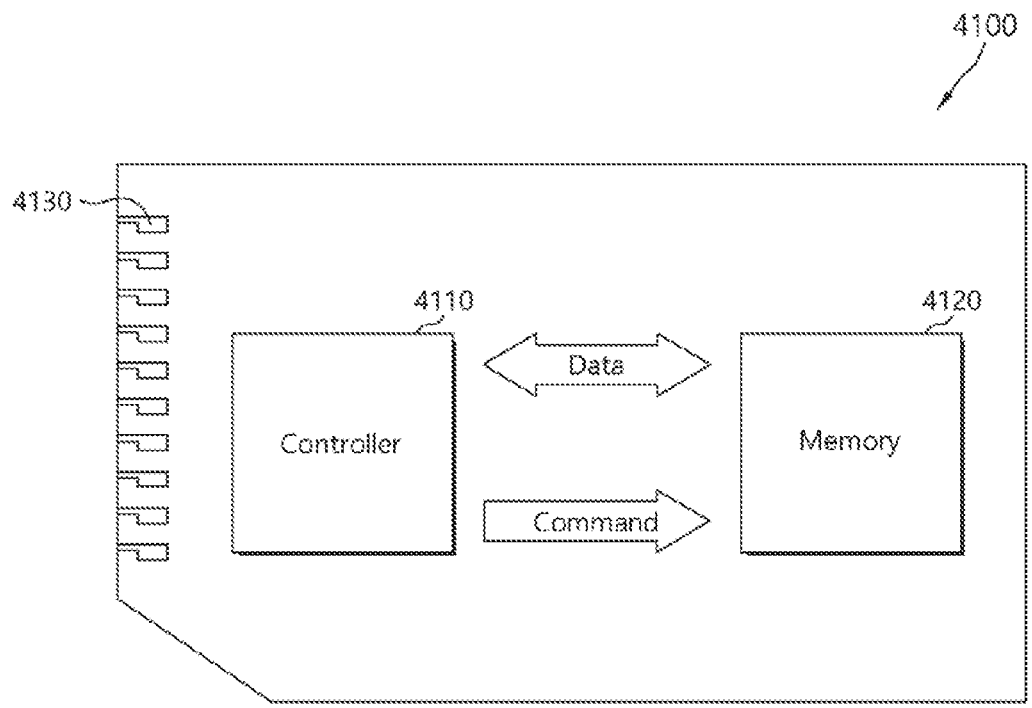
FIG. 8 illustrates a memory card including the semiconductor memory apparatus in accordance with an embodiment.

FIG. 8 illustrates a memory card including the semiconductor memory apparatuses in accordance with some embodiments. Referring to FIG. 8, the memory card system 4100 may include a controller 4110, a memory 4120, and interface members 4130. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to an exterior. The memory 4120 may include the semiconductor memory apparatuses 100 associated with FIG. 1.

Figure 9:
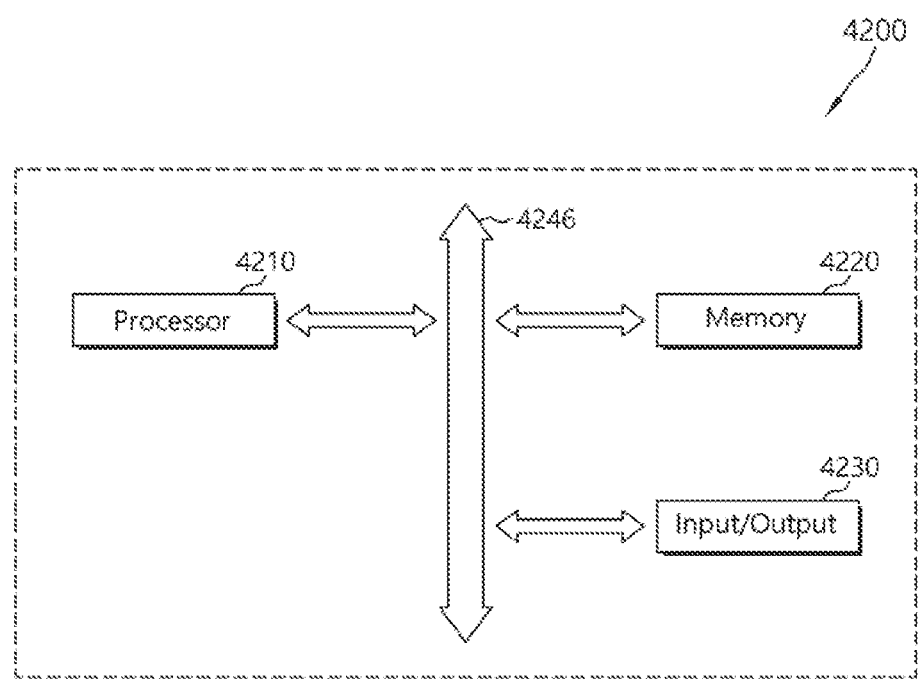
FIG. 9 illustrates a block diagram to assist in the explanation of an electronic apparatus including a semiconductor memory apparatus in accordance with an embodiment.

The interface members 4130 may control the input and output of data from/to the exterior. The memory card system 4100 may be a multimedia card (MMC), a secure digital card (SD), or a portable data storage device, FIG. 9 illustrates a block diagram to assist in the explanation of an electronic apparatus including the semiconductor memory apparatuses in accordance with some embodiments, Referring to FIG. 9, the electronic apparatus 4200 may include a processor 4210, a memory 4220, and an input and output device 4230. The processor 4210, the memory 4220, and the input and output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include the semiconductor memory apparatuses 100 associated with FIG. 1, In order for realization and modification, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or all devices capable of transmitting and receiving information under wireless circumstances.

Descriptions appear below for the realization and modified examples of the electronic apparatus 4200, with reference to FIGS. 10 and 11.

Figure 10:
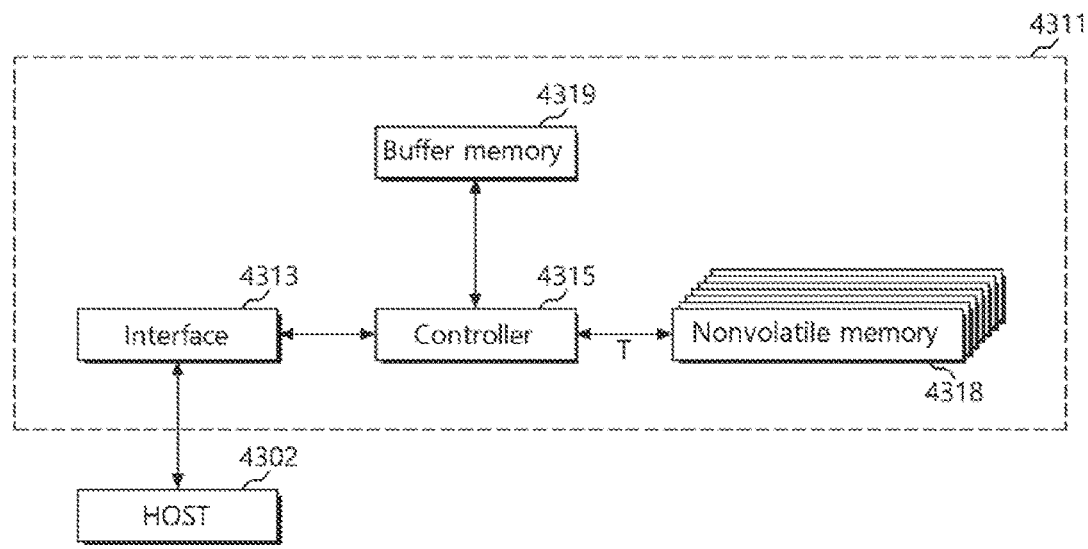
FIG. 10 illustrates a data storage device including a semiconductor memory apparatus in accordance with an embodiment.

FIG. 10 shows illustrates a data storage device including the semiconductor memory apparatuses in accordance with some embodiments. Referring to FIG. 10, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that speed is high, additionally, a mechanical delay, a failure rate, heat generation, and noise generation decrease, and miniaturization, and light weight may be accomplished, when compared to a hard disk drive (HDD). The solid state disk 4311 may be widely used in a notebook PC, a net book, a desktop PC, an MP3 player, or a portable storage device.

The controller 4315 may be formed adjacent to the interface 4313, and be electrically coupled to the interface 4313. The controller 4315 may be a microprocessor including a memory controller and a buffer controller. The nonvolatile memories 4318 may be formed adjacent to the controller 4315, and be electrically coupled to the controller 4315 via connection terminals T, The data storage capacity of the solid state disk 4311 may correspond to the nonvolatile memories 4318. The buffer memory 4319 may be formed adjacent to the controller 4315, and be electrically coupled to the controller 4315, Each of the nonvolatile memories 4220 may include the semiconductor memory apparatuses 100 associated with FIG. 1.

The interface 4313 may be coupled to a host 4302, and play the role of transmitting and receiving electrical signals such as data. For example, the interface 4313 may be a device which uses the same protocol as SATA, IDE, SCSI, and/or combination thereof. The nonvolatile memories 4318 may be coupled to the interface 4313 via the controller 4315.

The nonvolatile memories 4318 may play the role of storing the data received through the interface 4313, The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include the semiconductor memory apparatuses 100 associated with FIG. 1.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

Figure 11:
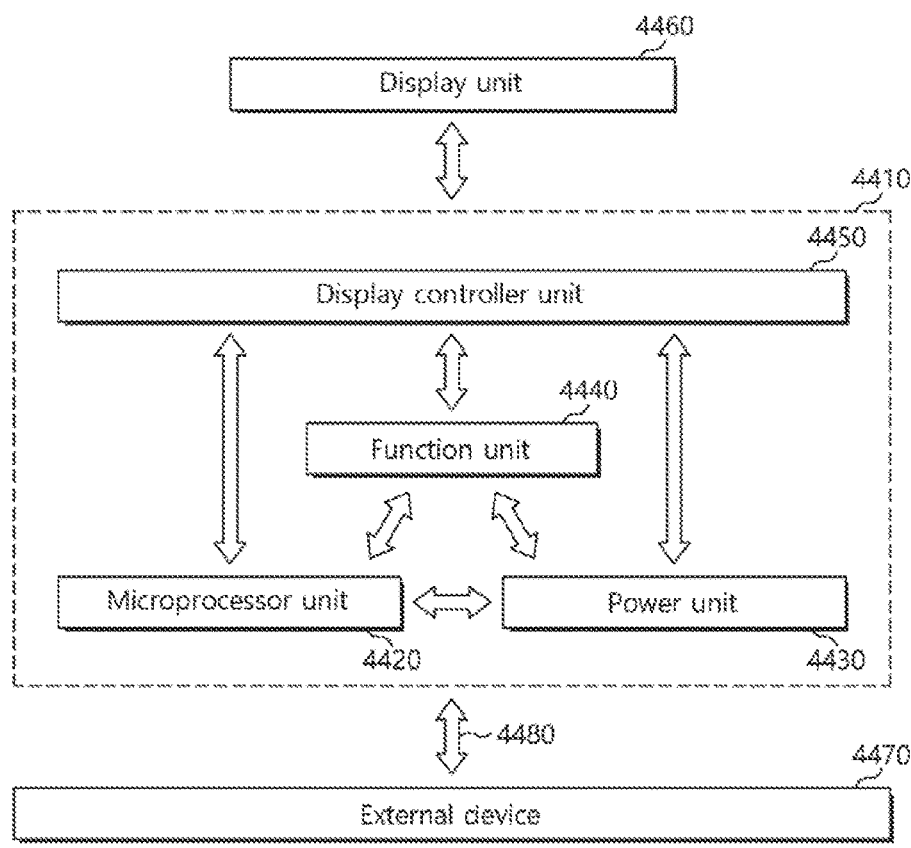
FIG. 11 illustrates an electronic system including a semiconductor memory apparatus in accordance with an embodiment.

FIG. 11 illustrates an electronic system including the semiconductor memory apparatuses in accordance with some embodiments. Referring to FIG. 11, the electronic system 4400 may include a body 4410, a microprocessor unit 4420, a power unit 4430, a function unit 4440, and a display controller unit 4450.

The body 4410 may be a motherboard which is formed by a printed circuit board (PCB), The microprocessor unit 4420, the power unit 4430, the function unit 4440, and the display controller unit 4450 may be mounted to the body 4410. A display unit 4460 may be disposed inside the body 4410 or outside the body 4410. For example, the display unit 4460 may be disposed on the surface of the body 4410, and display the image processed by the display controller unit 4450.

The power unit 4430 may play the role of receiving a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430, and control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone such as dialing, image outputting to the display unit 4460 through communication with an external device 4470, voice outputting to a speaker, and so forth. In the case where a camera is mounted together, the function unit 4440 may also play the role of a camera image processor.

In the case where the electronic system 4400 is coupled with a memory card or the like to extend capacity, the function unit 4440 may be a memory card controller. The function unit 4440 may exchange signals with the external device 4470 through a wired or wireless communication unit 4480. In the case where the electronic system 4400 needs a USB or the like to expand functionality, the function unit 4440 may play the role of an interface controller. The semiconductor memory apparatuses in accordance with the above-described embodiments may be applied as at least any one of the microprocessor unit 4420 and the function unit 4440.

While various embodiments have been described above, it will be understood to those skilled in the art that the embodiments described are examples only. Accordingly, the semiconductor memory apparatuses described herein should not be limited based on the described embodiments.

What is claimed is:

1. A semiconductor memory apparatus comprising:
a local data circuit disposed in a memory bank, coupled between a memory cell of the memory bank and a bank data line, and configured to perform an active write operation and an active read operation;
a global data circuit disposed outside the memory bank, and configured to perform a buffer write operation and a buffer read operation between the bank data line and a global data line; and
an input and output circuit coupled to the global data line, and configured to receive data from an external device or output data to the external device,
wherein the bank data line comprises a bank write line and a bank read line, and when the buffer read operation is performed after the buffer write operation is performed, the global data circuit outputs data located on the bank write line to the global data line.

2. The semiconductor memory apparatus according to claim 1, wherein, when the active write operation is performed after the buffer write operation is performed, the local data circuit writes data located on the bank write line to the memory cell.

3. The semiconductor memory apparatus according to claim 1, wherein, when the active write operation is performed after the active read operation is performed, the local data circuit writes data located on the bank read line to the memory cell.

4. The semiconductor memory apparatus according to claim 1, wherein the local data circuit does not perform a write operation on the memory cell when the data located on the bank write line and the data located on the bank read line are equal to each other.

5. The semiconductor memory apparatus according to claim 1, wherein, when the buffer read operation is performed after the active read operation is performed, the global data circuit outputs data located on the bank read line to the global data line.

6. The semiconductor memory apparatus according to claim 1, wherein, the local data circuit comprises:
a write driver configured to write write select data to the memory cell;
a sense amplifier configured to read the data stored in the memory cell and output the read data to the bank read line; and
a write data selector configured to output one of the data located on the bank write line and the data located on the bank read line as the write select data, based on a write mode signal.

7. The semiconductor memory apparatus according to claim 6, further comprising a comparator configured to generate a write driver off signal by comparing the data located on the bank write line to the data located on the bank read line based on an address flag, wherein the write driver is disabled when the write driver off signal is enabled, and does not perform a write operation.

8. The semiconductor memory apparatus according to claim 6, further comprising a write mode signal generator configured to generate the write mode signal based on a buffer write signal and an active read signal.

9. The semiconductor memory apparatus according to claim 6, wherein the local data circuit comprises:

a first latch configured to latch the data of the bank write line; and a second latch configured to latch the data of the bank read line.

10. The semiconductor memory apparatus according to claim 1, wherein the global data circuit comprises:

a write latch configured to output data transferred through the global data line to the bank write line based on a buffer write signal;

a read latch configured to output read select data to the global data line based on a buffer read signal; and a read data selector configured to output one of the data located on the bank data line and the data located on the bank read line as the read select data, based on a read mode signal.

11. The semiconductor memory apparatus according to claim 10, further comprising a read mode signal generator configured to generate the read mode signal based on a buffer write signal and an active read signal.

12. A semiconductor memory apparatus comprising:

a memory bank disposed in a core region, and including a local data circuit;

a global buffer array disposed in a peripheral region separated from the core region, and including a global data circuit operably coupled to the local data circuit; and an input and output circuit disposed in the peripheral region, and coupled to the global buffer array, wherein the local data circuit performs an active write operation and an active read operation between the memory bank and the global buffer array, and the global buffer array performs a buffer write operation and a buffer read operation between the local data circuit and the input and output circuit, wherein the local data circuit is coupled to the global data circuit through a bank write line and a bank read line, and when the buffer read operation is performed after the buffer write operation, the global data circuit outputs data to the global data line based on the data located on the bank write line.

13. The semiconductor memory apparatus according to claim 12, wherein the global buffer array is disposed more adjacent to the core region than the input and output circuit, and the global data circuit is coupled to the input and output circuit through a global data line.

14. The semiconductor memory apparatus according to claim 13, wherein, when performing the active write operation, the local data circuit writes data to a selected memory cell of the memory bank based on one of data located on the bank write line and data located on the bank read line.

15. The semiconductor memory apparatus according to claim 14, wherein, when the buffer write operation is performed before the active write operation, the local data circuit writes the data to the selected memory cell based on the data located on the bank write line.

16. The semiconductor memory apparatus according to claim 14, wherein, when the active read operation is performed before the active write operation, the local data circuit writes the data to the selected memory cell based on the data located on the bank read line.

17. The semiconductor memory apparatus according to claim 14, wherein, when the active read operation is performed before the buffer read operation, the global data circuit outputs data to the global data line based on the data located on the bank read line.

18. The semiconductor memory apparatus according to claim 13, wherein when the active write operation is performed on a selected memory cell after the active read operation is performed on a selected memory cell of the memory bank, the local data circuit compares data located on the bank write line to data located on the bank read line.

19. The semiconductor memory apparatus according to claim 18, wherein the local data circuit writes data to the selected memory cell based on the data located on the bank write line, when the data located on the bank write line and the data located on the bank read line are different from each other, and does not perform a write operation on the selected memory cell when the data located on the bank write line and the data located on the bank read line are equal to each other.

20. The semiconductor memory apparatus according to claim 13, further comprising a plurality of memory banks arranged in the core region and each memory bank including a local data circuit which is included in a memory bank from the plurality of memory banks in a one-to-one manner, wherein the global buffer array further comprises a plurality of global data circuits operably coupled to the local data circuits in a one-to-one manner, each of the local data circuits included a memory bank, from the plurality of memory banks, in a one-to-one manner.

* * * * *